United States Patent
Lee et al.

(10) Patent No.: US 7,028,761 B2
(45) Date of Patent: Apr. 18, 2006

(54) INTEGRATED LIQUID COOLING SYSTEM FOR ELECTRICAL COMPONENTS

(76) Inventors: Hsieh Kun Lee, 1650 Memorex Dr., Santa Clara, CA (US) 95050; Cheng-Tien Lai, 1650 Memorex Dr., Santa Clara, CA (US) 95050; Shi Wen Zhou, 1650 Memorex Dr., Santa Clara, CA (US) 95050

( * ) Notice: Subject to any disclaimer, the term of this patent is extended or adjusted under 35 U.S.C. 154(b) by 0 days.

(21) Appl. No.: 10/901,749

(22) Filed: Jul. 28, 2004

(65) Prior Publication Data

US 2005/0082040 A1 Apr. 21, 2005

(30) Foreign Application Priority Data

Oct. 15, 2003 (TW) .............................. 92218324 U

(51) Int. Cl.
*F28D 15/00* (2006.01)

(52) U.S. Cl. .............................. 165/104.33; 165/80.4; 361/699; 257/715; 174/15.1

(58) Field of Classification Search ........... 165/104.33, 165/104.21, 107.19, 80.4, 185; 361/697, 361/699, 698; 257/714–716; 774/15.1
See application file for complete search history.

(56) References Cited

U.S. PATENT DOCUMENTS

| | | | | | |
|---|---|---|---|---|---|
| 6,005,772 | A | * | 12/1999 | Terao et al. | 361/699 |
| 6,019,165 | A | * | 2/2000 | Batchelder | 165/80.3 |
| 6,263,957 | B1 | * | 7/2001 | Chen et al. | 165/80.4 |
| 6,600,649 | B1 | * | 7/2003 | Tsai et al. | 361/697 |
| 6,655,449 | B1 | * | 12/2003 | Hsien | 165/80.4 |
| 6,687,122 | B1 | * | 2/2004 | Monfarad | 361/687 |
| 2004/0052048 | A1 | * | 3/2004 | Wu et al. | 361/699 |

FOREIGN PATENT DOCUMENTS

| CN | ZL98248834.3 | 11/1999 |
|---|---|---|
| CN | ZL99210734.2 | 4/2000 |

* cited by examiner

*Primary Examiner*—Terrell Mckinnon
(74) *Attorney, Agent, or Firm*—Wei Te Chung

(57) ABSTRACT

A liquid cooling system includes a cooling unit (100) and a coolant driving unit (200). The cooling unit includes a first cooling body (110) defining a first cavity, a second cooling body (130) defining a second cavity in communication with the first cooling body (110), and a heat sink (150) sandwiched between the first and second cooling bodies. The coolant driving unit is in flow communication with the first and second cooling bodies respectively, so that the first and second cooling bodies and the coolant driving unit together form a loop. Circulation of the coolant in the loop causes the heat generated by the heat generating component to be capable of being transferred from the first and second cooling bodies to the heat sink for dissipation.

14 Claims, 3 Drawing Sheets ized to dissipate heat from the heat sink 150 to ambient air.

INTEGRATED LIQUID COOLING SYSTEM FOR ELECTRICAL COMPONENTS

BACKGROUND OF THE INVENTION

1. Field of the Invention

The present invention relates generally to cooling systems, and more particularly to a liquid cooling system for rapidly cooling an electrical component such as a Central Processing Unit (CPU).

2. Related Art

With the continuing development of computer electronics technology, new electronic packages such as the latest CPUs can perform more and more functions. Heat generated by these modern electronic packages has increased commensurately. The heat must be removed from the CPUs to prevent them becoming unstable or being damaged. Traditional cooling means such as combined heat sinks and cooling fans are increasingly unable to provide satisfactory cooling performance. Under such circumstances, cooling systems using liquid cooling technology have been developed for cooling the CPUs.

Chinese patent numbers 98248834.3 and 99210734.2 respectively disclose such a kind of cooling system. This kind of cooling system generally comprises a cooling base contact the CPU for absorbing heat generated by the CPU. The cooling base generally defines a cavity for receiving liquid coolant therein, and an inlet and an outlet both in communication with the cavity. The cooling system also comprises a heat sink and a pump arranged at proper places within a computer enclosure. A first tube connects the inlet of the cooling base and the pump, so that the coolant enters the cavity along the first tube. A second tube connects the outlet of the cooling base and the pump, so that the heated coolant exits from the cavity along the second tube. The second tube extends through the heat sink, whereupon heat of the heated coolant is transferred to the heat sink to radiate to ambient air. Thus, the heat of the CPU is continuously taken away by circulation of the coolant.

However, the cooling base, the tubes, the heat sink, and the pump are discrete components prior to attachment within the computer enclosure. Installation and removal of the cooling system can be troublesome and problematic. In addition, a large space for receiving these discrete components is required. This militates against the trend of electrical devices becoming more and more smaller.

SUMMARY OF THE INVENTION

Accordingly, an object of the present invention is to provide a liquid cooling system which occupies a relatively small space.

Another object of the present invention is to provide a liquid cooling system which can be readily installed or removed to or from an electrical enclosure.

To achieve the above-mentioned objects, a liquid cooling system in accordance with a preferred embodiment of the present invention comprises a cooling unit and a coolant driving unit. The cooling unit comprises a first cooling body for contacting a heat generating component, a second cooling body, and a heat sink sandwiched between the first and second cooling bodies. The first cooling body defines a first cavity therein. The second cooling body defines a second cavity therein in flow communication with the first cavity. The coolant driving unit is in flow communication with the first and second cooling bodies respectively, so that the first and second cooling bodies and the coolant driving unit together form a loop. Circulation of the coolant in the loop causes the heat generated by the heat generating component to be capable of being transferred from the first and second cooling bodies to the heat sink for dissipation.

Other objects, advantages and novel features of the present invention will be drawn from the following detailed description of the preferred embodiment of the present invention with attached drawings, in which:

DESCRIPTION OF THE PREFERRED EMBODIMENT

Figure 1:
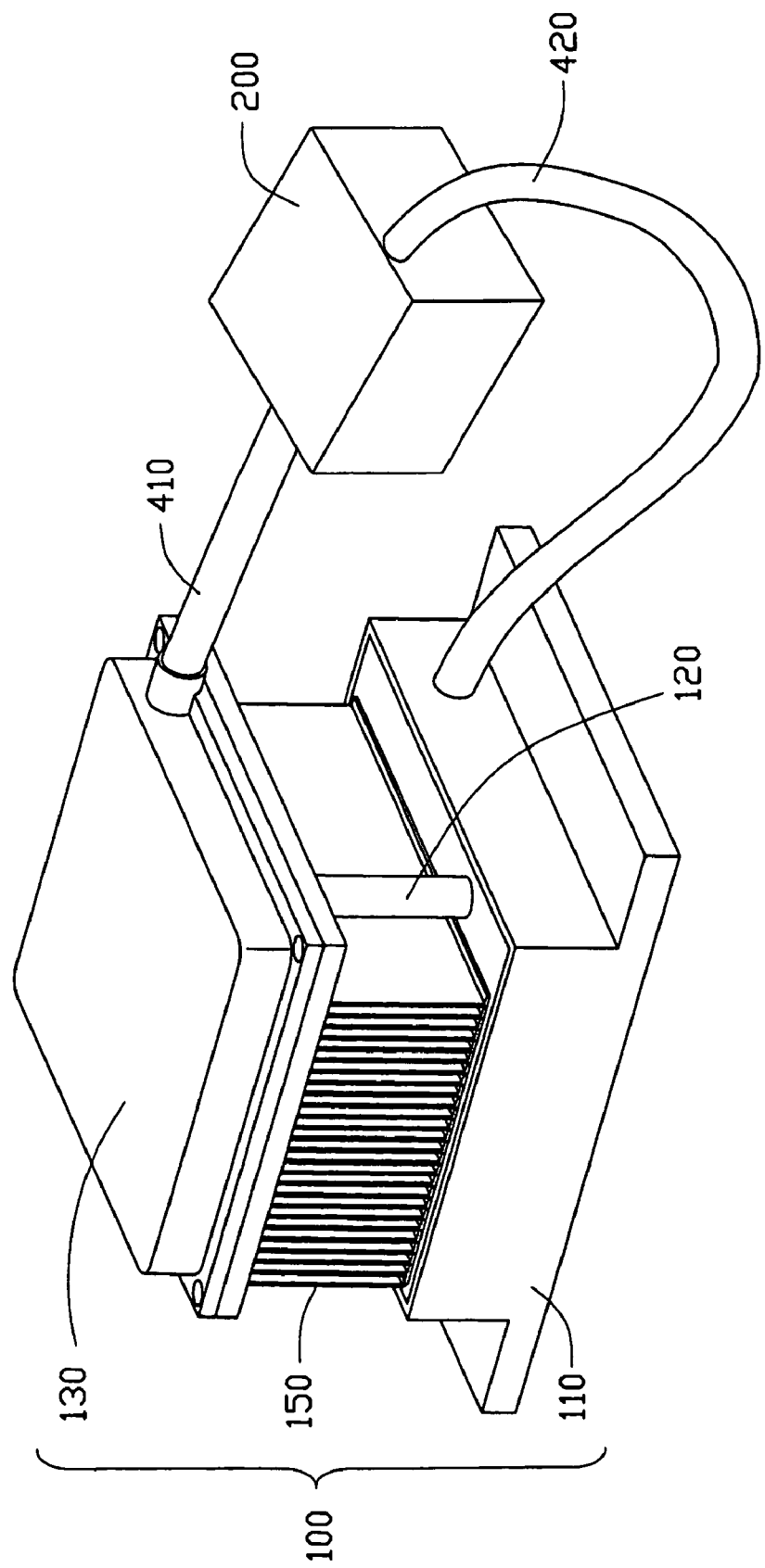
FIG. 1 is an assembled, isometric view of a liquid cooling system in accordance with the preferred embodiment of the present invention, the liquid cooling system comprising a cooling unit, and a coolant driving unit connected to the cooling unit by two pipes.

FIG. 1 illustrates a liquid cooling system in accordance with a preferred embodiment of the present invention. The liquid cooling system comprises a cooling unit 100 for being located on a heat generating component such as a computer CPU (not shown), and a coolant driving unit 200 connected to the cooling unit 100 by two pipes 410, 420. It should be noted that the coolant driving unit 200 is schematized as a labeled box. In the preferred embodiment, the coolant driving unit 200 comprises a tank filled with coolant, and a pump disposed in the tank.

Figure 2:
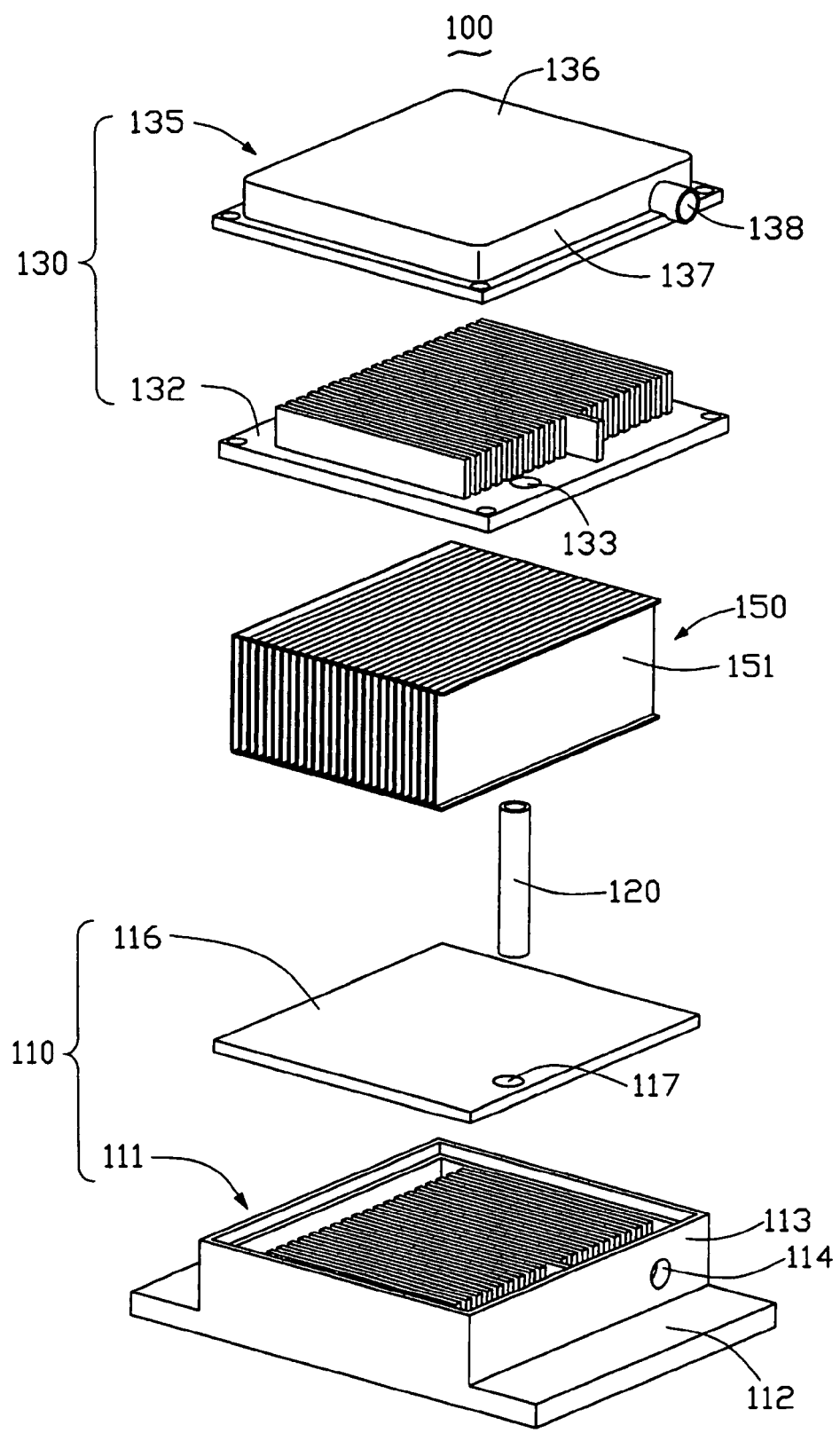
FIG. 2 is an exploded, isometric view of the cooling unit of the liquid cooling system of FIG. 1, the cooling unit comprising a first cooling body, a second cooling body, and a heat sink sandwiched between the first and second cooling bodies.

Referring to FIG. 2, the cooling unit 100 comprises a first cooling body 110, a second cooling body 130 connected to the first cooling body 110 by a duct 120, and a heat sink 150 sandwiched between the first and second cooling bodies 110, 130.

The heat sink 150 comprises of a plurality of plate-like cooling fins 151 connected to each other. The heat sink 150 comprises opposite top and bottom sides.

The first cooling body 110 comprises a cooling base 111, and a cover 116 hermetically mounted to the cooling base 111. The cooling base 111 is used to contact a top surface of the CPU, for absorbing heat generated by the CPU. The cover 116 is used to contact the bottom side of the heat sink 150, for conducting heat to the heat sink 150 far dissipation. The cooling base 111 comprises a cooling plate 112, and four sidewalls 113 extending upwardly from the cooling plate 112. Each sidewall 113 joins with adjacent sidewalls 113 at opposite ends thereof, so that the sidewalls 113 cooperatively define a first cavity (not labeled) therebetween. The cover 116 is hermetically attached to top edges of the sidewalls 113, to close the first cavity. A flow inlet port 114 is defined in one of the sidewalls 113, in communication with the first cavity. A through hole 117 is defined in the cover 116, in communication with the first cavity. Coolant can enter the first cavity via the flow inlet port 114, and exit the first cavity via the through hole 117. In the first cavity, the coolant absorbs the heat of the cooling plate 112, and then transfers the heat to the cover 117.

Figure 3:
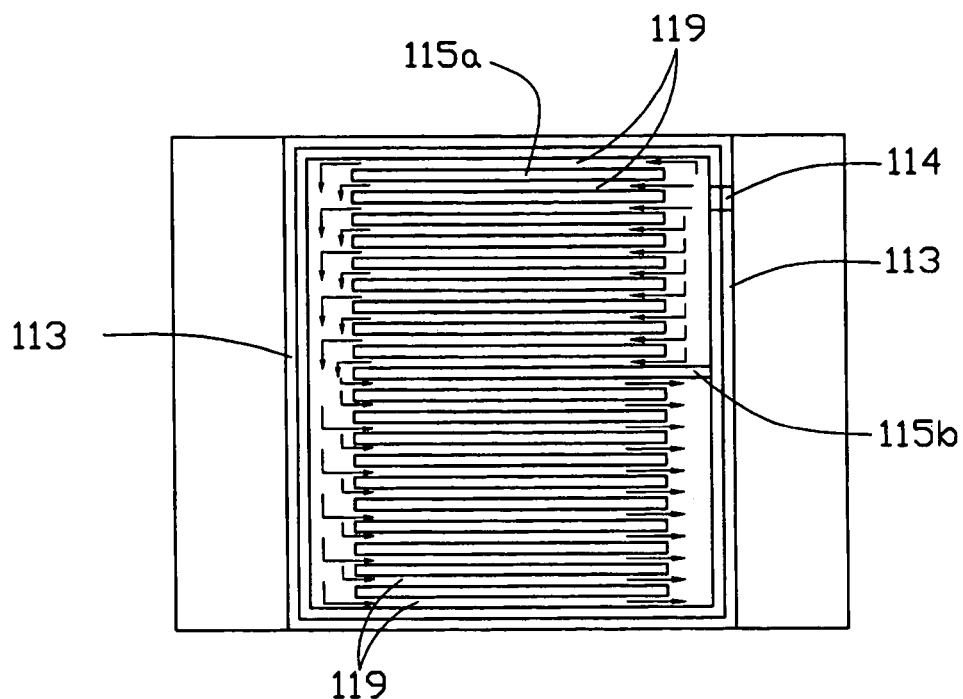
FIG. 3 is a top plan view of a first cooling base of the first cooling body of the cooling unit of FIG. 2.

Referring also to FIG. 3, a plurality of parallel, evenly spaced inner walls extends upwardly from the cooling plate 112 within the first cavity, parallel to one of the sidewalls 113. There are two kinds of inner walls, respectively designated as 115a and 115b. There is a plurality of inner walls 115a. Opposite ends of each inner wall 115a are spaced from corresponding opposite sidewalls 113 a distance. There is only one inner wall 115b. One end of the inner wall 115b is spacing spaced from a corresponding one of said opposite sidewalls 113 a distance. An opposite end of the inner wall 115b is hermetically connected to the other of said opposite sidewalls 113. Top edges of the inner walls 115a, 115b are all hermetically connected to the cover 116 by suitable means, such as soldering. A plurality of parallel, evenly spaced flow channels 119 is thus defined in the first cavity between adjacent inner walls 115a, 115b, as illustrated by arrows in FIG. 3.

Referring back to FIG. 2, the second cooling body 130 comprises a bottom plate 132, and a cap 135 hermetically covering the bottom plate 131. The bottom plate 131 is used to contact the top side of the heat sink 150, for conducting the heat to the heat sink 150 for dissipation. A through aperture 133 is defined in the bottom plate 132, corresponding to the through hole 117 of the cover 16. The cap 135 comprises a top plate 136, and four side flanges 137 extending downwardly from sides of the top plate 136. When the cap 135 is hermetically attached to the bottom plate 132, a second cavity is defined between the bottom plate 132 and the cap 135. The duct 120 connects the through hole 117 to the through aperture 133, thereby allowing the first and second cavities of the first and second cooling bodies 110, 130 to communicate with each other. A flow outlet port 138 is formed at one of the side flanges 137, in communication with the second cavity of the second cooling body 130. The coolant can enter the second cavity of the second cooling body 130 via the through aperture 133, and exit the second cavity of the second cooling body 130 via the flow outlet port 138. In the second cavity, the coolant transfers heat to the bottom plate 132.

Figure 4:
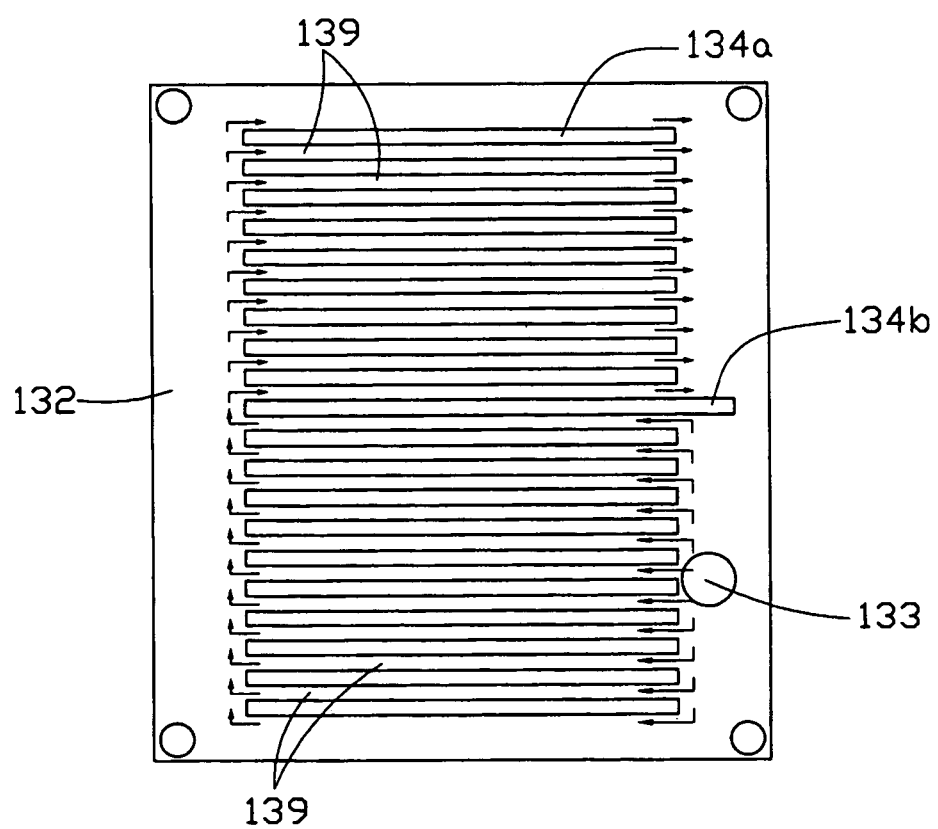
FIG. 4 is a top plan view of a second cooling base of the second cooling body of the cooling unit of FIG. 2.

Referring also to FIG. 4, a plurality of parallel, evenly spaced ribs extends upwardly from the bottom plate 132 within the second cavity, parallel to one of the side flanges 137. There are two kinds of ribs, respectively designated as 134a and 134b. There is a plurality of ribs 134a. Opposite ends of each rib 134a are spaced from corresponding opposite side flanges 137 of the cap 135 a distance. There is only one rib 134b. One end of the rib 134b is spaced from a corresponding one of said opposite side flanges 137 a distance. An opposite end of the rib 134b is hermetically connected to the other of said opposite sidewalls 137. Top edges of the ribs 134a, 134b are all hermetically connected to the top plate 136 of the cap 135 by suitable means, such as soldering. A plurality of parallel, evenly spaced flow channels 139 are thus defined in the second cavity between adjacent ribs 134a, 134b, as illustrated by arrows in FIG. 4.

In operation of the liquid cooling system, heat is transferred from the CPU to the cooling plate 112 and the inner walls 115a, 115b of the first cooling body 110, and then conducted to the coolant. Simultaneously, the coolant within the first cavity gets hot. The heat is then partially transferred from the coolant to the cover 116 of the first cooling body 110 as the coolant flows in the first cavity of the first cooling body 110. The heat is then conducted to the heat sink 150 for dissipation.

Then, the hot coolant exits the first cavity, and enters the second cavity of the second cooling body 130. The heat of the hot coolant is absorbed by the bottom plate 132 and the ribs 134a, 134b of the second cooling body 130. The heat of the bottom plate 132 and the ribs 134a, 134b is conducted to the heat sink 150, whereupon the heat is radiated to ambient air.

In the present invention, the first and second cooling bodies 110, 130, and the pump together form a loop. Circulation of the coolant in the loop continuously takes the heat away from the cooling plate 112 of the first cooling body 110, and distributes the heat to the cover 116 of the first cooling body 110 and the bottom plate 132 of the second cooling body 130. The heat of the cover 116 and the bottom plate 132 is then continuously transferred to the heat sink 150 for dissipation, whereupon the heat is removed from the entire system. In addition, the first and second cooling bodies 110 130, and the heat sink 150 are integrated into the cooling unit 100. Therefore, installation or removal of the liquid cooling system is simplified.

It is understood that the invention may be embodied in other forms without departing from the spirit thereof. The above-described examples and embodiments are to be considered in all respects as illustrative and not restrictive, and the invention is not to be limited to the details given above.

The invention claimed is:

1. A liquid cooling system for a heat generating component, the liquid cooling system comprising:
    a cooling unit comprising a first cooling body adapted for contacting the heat generating component to absorb heat therefrom, a second cooling body, and a heat sink sandwiched between the first and second cooling bodies, the first cooling body defining a first cavity therein, the second cooling body defining a second cavity therein, the first and second cavities being in flow communication with each other so that coolant is able to flow from the first cooling body to the second cooling body; and
    a coolant driving unit being in flow communication with the first and second cooling bodies respectively so that the first cooling body, the second cooling body, and the coolant driving unit together form a loop; wherein
    circulation of the coolant in the loop causes the heat generated by the heat generating component to be capable of being transferred from the first and second cooling bodies to the heat sink for dissipation;
    wherein the first cooling body comprises a cooling base, and a cover attached to the cooling base and thermally contacting the heat sink, and the first cavity is defined between the cooling base and the cover;
    wherein the cooling base comprises a cooling plate adapted for absorbing the heat from the heat generating component, and a plurality of sidewalls extending from the cooling plate and cooperatively defining the first cavity; and
    wherein one of the sidewalls defines a flow inlet port in communication with the first cavity.

2. The liquid cooling system as described in claim 1, wherein the cover defines a through hole in communication with the first cavity.

3. The liquid cooling system as described in claim 1, wherein the cooling base comprises a plurality of inner walls extending from the cooling plate, and top edges of the inner walls are connected to the cover so that a plurality of flow channels is defined in the first cavity between adjacent inner walls.

4. A liquid cooling system for a heat generating component, the liquid cooling system comprising:
    a cooling unit comprising first cooling body adapted for contacting the heat generating component to absorb heat therefrom, a second cooling body, and a heat sink sandwiched between the first and second cooling bodies, the first cooling body defining a first cavity therein, the second cooling body defining a second cavity therein, the first and second cavities being in flow communication with each other so that coolant is able to flow from the first cooling body to the second cooling body; and a coolant driving unit being in flow communication with the first and second cooling bodies respectively so that the first cooling body, the second cooling body, and the coolant driving unit together form a loop; wherein circulation of the coolant in the loop causes the heat generated by the heat generating component to be capable of being transferred from the first and second cooling bodies to the heat sink for dissipation;

wherein the first cooling body comprises a cooling base, and a cover attached to the cooling base and thermally contacting the heat sink, and the first cavity is defined between the cooling base and the cover;

wherein the cooling base comprises a cooling plate adapted for absorbing the heat from the heat generating component, and a plurality of sidewalk extending from the cooling plate and cooperatively defining the first cavity;

wherein the cooling base comprises a plurality of inner walls extending from the cooling plate, and top edges of the inner walls are connected to the cover so that a plurality of flow channels is defined in the first cavity between adjacent inner walls; and wherein one of the inner walls that is located at a middle portion of the first cavity has a first end spaced from one of opposite sidewalls a distance, and has an opposite second end hermetically connected to the other of the opposite sidewalls, and each of the other inner walls has opposite first and second ends spaced from the opposite sidewalls a distance.

5. A liquid cooling system for a heat generating component, the liquid cooling system comprising:

a cooling unit comprising a first cooling body adapted for contacting the heat generating component to absorb heat therefrom, a second cooling body, and a heat sink sandwiched between the first and second cooling bodies, the first cooling body defining a first cavity therein, the second cooling body defining a second cavity therein, the first and second cavities being in flow communication with each other so that coolant is able to flow from the first cooling body to the second cooling body; and a coolant driving unit being in flow communication with the first and second cooling bodies respectively so that the first cooling body, the second cooling body, and the coolant driving unit together form a loop; wherein circulation of the coolant in the loop causes the heat generated by the heat generating component to be capable of being transferred from the first and second cooling bodies to the heat sink for dissipation;

wherein the second cooling body comprises a bottom plate thermally contacting the heat sink and a cap attached to the bottom plate, and the second cavity is defined between the bottom plate arid the cap.

6. The liquid cooling system as described in claim 5, wherein the bottom plate defines a through aperture in communication with the second cavity.

7. The liquid cooling system as described in claim 5, wherein the second cooling body comprises a plurality of ribs extending from the bottom plate.

8. The liquid cooling system as described in claim 7, wherein the cap comprises a top plate, and a plurality of side flanges extending from edges of the top plate.

9. The liquid cooling system as described in claim 8, wherein one of the side flanges defines a flow outlet port in communication with the second cavity.

10. The liquid cooling system as described in claim 8, wherein one of the ribs that is located at a middle portion of the second cavity has a first end spaced from one of opposite side flanges a distance, and has an opposite second end hermetically connected to the other of the opposite side flanges, and each of the other ribs has opposite first and second ends spaced from the opposite side flanges a distance.

11. A liquid cooling system for a heat generating component, the liquid cooling system comprising:

a cooling unit comprising a first cooling body adapted for contacting the heat generating component to absorb heat therefrom, a second cooling body discretely spaced from the first cooling body, and a heat sink engaged with both the first and second cooling bodies, the first cooling body defining a first cavity therein, the second cooling body defining a second cavity therein;

a duct connected between the first cooling body and the second cooling body and in flow communication with the corresponding first cavity and second cavity, respectively;

a coolant driving unit being in flow communication with the corresponding first and second cavities of the first and second cooling bodies respectively via pipes; and coolant circulating in a loop between the first and second cavities, the circulating coolant causing heat generated by the heat generating component to be capable of being transferred among the first and second cooling bodies and the heat sink for dissipation;

wherein said duct does not contact the heat sink.

12. The system as described in claim 11, wherein the first cooling body and the second cooling body are parallel to each other.

13. The system as described in claim 11, wherein the heat sink includes a plurality of cooling fins.

14. The system as described in claim 13, wherein the fins are perpendicular to both the first and second cooling bodies.

* * * * *